United States Patent [19]
Schuelein et al.

[11] Patent Number: 6,113,648
[45] Date of Patent: *Sep. 5, 2000

[54] METHOD AND APPARATUS FOR PROTECTING GATE ELECTRODES OF TARGET TRANSISTORS IN THE GATE ARRAY FROM GATE CHARGING BY EMPLOYING FREE TRANSISTORS IN THE GATE ARRAY

[75] Inventors: Mark Edward Schuelein, Tempe; Edward Butler, Chandler, both of Ariz.

[73] Assignee: Intel Corporation, Santa Clara, Calif.

[*] Notice: This patent is subject to a terminal disclaimer.

[21] Appl. No.: 09/024,830

[22] Filed: Feb. 17, 1998

Related U.S. Application Data

[62] Division of application No. 08/672,411, Jun. 28, 1996, Pat. No. 5,793,069.

[51] Int. Cl.[7] .............................. H01L 23/62; H01L 27/10

[52] U.S. Cl. ............................................................ 716/17

[58] Field of Search ........................ 395/500.18, 500.17; 716/17, 16

[56] References Cited

U.S. PATENT DOCUMENTS

| | | | |
|---|---|---|---|
| 5,581,103 | 12/1996 | Mizukami | 257/355 |
| 5,623,420 | 4/1997 | Yee et al. | 395/500.02 |
| 5,760,445 | 6/1998 | Diaz | 257/356 |
| 5,793,069 | 8/1998 | Schuelein et al. | 257/208 |
| 5,892,379 | 4/1999 | Buxo et al. | 327/112 |

*Primary Examiner*—Paul R. Lintz
*Assistant Examiner*—Margaret Joyce
*Attorney, Agent, or Firm*—Blakely, Sokoloff, Taylor & Zafman LLP

[57] ABSTRACT

In a gate array having a plurality of free transistors and target transistors, a method and apparatus for protecting a gate electrode of a target transistor from gate charge by employing a free transistor as a gate electrode protection device. A target transistor is a transistor that has been determined to need gate charging protection. A free transistor is a transistor in the gate array which is not used to implement the logic design as embodied in the gate array. Initially, a base array is formed without any metal layers. Then, a determination is made as to which transistors require gate charging protection. The gate electrode of each target transistor determined to require gate charging is coupled to an associated drain or source electrode of a free transistor of the gate array. The gate electrode of the free transistor is connected to an appropriate voltage reference to turn the free transistor off.

6 Claims, 14 Drawing Sheets

METHOD AND APPARATUS FOR PROTECTING GATE ELECTRODES OF TARGET TRANSISTORS IN THE GATE ARRAY FROM GATE CHARGING BY EMPLOYING FREE TRANSISTORS IN THE GATE ARRAY

The present application is a Divisional of application Ser. No. 08/672,411 now U.S. Pat. No. 5,793,069, filed Jun. 28, 1996 by Applicants Schuelein, et al., entitled: entitled: APPARATUS FOR PROTECTING GATE ELECTRODES OF TARGET TRANSISTORS IN A GATE ARRAY FROM GATE CHARGING BY EMPLOYING FREE TRANSISTORS IN THE GATE ARRAY.

BACKGROUND OF THE INVENTION

1. Field of the Invention

The present invention relates to integrated circuits and more particularly to gate arrays. Specifically, the present invention provides a method and apparatus for protecting gate electrodes of target transistors in the gate array from gate charging by employing free transistors in the gate array.

2. Description of the Related Art

A gate array or uncommitted logic array (ULA) is a simple form of large scale integration (LSI) logic. Gate arrays are an example of a larger category of circuit known as semi-custom integrated circuits. Gate arrays are manufactured by first employing a defined set of mask steps (i.e. masking levels used in the manufacturing of semiconductors) to create a basic array of cells (base array). This base array includes a predetermined set of unconnected transistors.

An additional defined set of mask levels are then employed to determine the overall function of the gate array. These additional mask levels are unique to a specific logical implementation (i.e., the functional application that is to be achieved) and interconnect the gate array transistors. The additional mask steps can be designed and applied to the standard gate array quickly and relatively inexpensively as compared to a full custom implementation of the same overall functional application.

Typically, gate array cells are laid out in a row and column fashion. Gate arrays can incorporate as many gate array cells as necessary to accomplish the functional application. Of course, as with all other Very Large Scale Integration (VLSI) design implementations, application specifications must warrant the use of the gate array methodology.

Semi-custom integrated circuits typically require multiple masking levels to make the transistors and other circuit elements for the semi-custom integrated circuits. These multiple masking levels are standardized and are independent of the final application (i.e. independent of the actual logic design). Since these multiple masking levels are standardized, the integrated circuit wafers can be processed in advance with the standard pattern levels.

Typically, additional pattern levels are then employed to determine the overall function of the gate array chip (i.e., to implement the logic design). These additional pattern levels, which are unique to the specific application, provide the desired interconnections. These additional pattern levels can be designed and applied to the standard gate array wafer quickly and inexpensively as compared to the time and cost of developing a completely unique LSI circuit for the same overall function.

Gate arrays typically incorporate between one hundred to several thousand NOR or NAND gate circuits on a chip. These gate circuits are typically arranged in rows and columns. One advantage of gate arrays is that they can typically replace five to fifty separate small scale integration (SSI) and medium scale integration (MSI) chips. Moreover, implementing logic designs in gate arrays can lead to substantial reductions in (larger) physical size, (higher) power consumption, and total cost of a complete system. Furthermore, the reliability and high-speed performance of the integrated circuit may be improved because the number of off-chip connections is greatly decreased. Also, it is generally more difficult for a competitor to copy a product built using gate arrays than a product built from standard SS and MSI components.

When produced in large quantities, integrated circuits can be very economical. However, producing integrated circuits in low volume can be prohibitively expensive. Low volume runs are important for certain specialized applications and also for the intermediate development stage of integrated circuits that are eventually targeted for large volume production.

An industry has emerged to provide for relatively low-cost, easy to design, "semi" custom integrated circuits. These semi-custom circuits are also referred to as "application-specific integrated circuits" or ASICs. One of the earlier and still one of the most widely used types of ASIC is the CMOS gate array. A gate array, as will be explained in greater detail hereinafter, is an integrated circuit where the circuit elements (e.g., transistors) are predefined, and the interconnections between those circuit elements are not defined. Customization for specific applications is achieved by forming the interconnects between the circuit elements.

Since several different integrated circuit designs (i.e., logic designs) can be based upon the same base array, cost savings may be realized in the relatively high volume production of the base array. As will be explained in greater detail hereinafter, the customization also takes advantage of the economies of scale, since the different custom logic designs typically require only different contact and metalization masks. Accordingly, gate arrays provide many of the cost savings associated with large volume runs to small volume ASIC runs.

One of the problems that CMOS gate arrays share with other integrated circuits, is vulnerability to gate charge. During the process of building silicon wafers, there is a potential for damage to occur to the transistors during metalization. Metalization is the process when the transistors are connected together with metal layers to form the logic design. For example, the process of patterning the metal can cause excess electrical charge to build up on the gates of the transistors. During metalization, it is common to use ion beams to cut (or etch) metal. These ion beams deposit charges on the metal. These charges travel freely on the metal to damage the gate electrode of any transistor that is coupled to the metal.

Specifically, these charges build up on the polysilicon and cause charges to embed in the gate oxide layer that is below the polysilicon. This build up of charge in the gate oxide degrades transistor performance and reduces the effective life of a transistor. For example, charge build-up in the gate oxide may lead to gate leakage, which reduces the drive capacity of the transistor. Also, if the build-up of charge is large enough, it can cause permanent damage to the transistor In a full-custom chip or a standard cell, the logic design is known, and problem nodes (e.g., nodes that may be susceptible to gate charge damage) are easily identified during the design phase. Protection for these nodes of transistors is designed for specifically in the layout. However, with a gate array, the logic function of the array or of each cell in the array is unknown until after the metal layers are added and the connections are made. In other words, in a gate array, each transistor requires protection since each transistor is susceptible to gate charge as the final logic design is unknown.

When the length of a metal trace between a drive transistor and the next transistor is greater than a predetermined trace length, this gate charge problem (also known as "floating gate" problem or the "node antenna" problem) arises. This problem arises when the drive transistor is coupled to the target transistor by employing two different metal layers (the floating gate problem).

If the length of metal trace that couples a drive transistor to a target transistor, which may need protection, is below a predetermined length this gate charge problem is not significant. Accordingly, one approach to solve the gate charge problem is to impose stringent layout rules that require the length of metal trace that couples a drive transistor to a target transistor to be less than a specified length. However, this layout rule is restrictive and at times impossible to meet while simultaneously meeting the performance and transistor density criteria of the integrated circuit.

A solution to this gate charge problem is to couple the gate electrode of the target transistor to a protection diode. As noted, this approach to the gate charge problem is of connecting the gate electrode of the target transistor to a protection device is appropriate when the gate electrode floats. The diode, which is used as a protection device, is specifically designed into the gate array. These diodes prevent charge build-up on the gate electrode of the target transistor.

For custom designs, this approach works relatively well because the problem transistors are generally known ahead of time. Therefore, not all transistors are exposed to this gate charge problem and accordingly do not require a protection diode.

However for gate arrays, since each transistor may be a target transistor, a protection diode would need to be designed into the integrated circuit for each transistor to insure protection, since the final design is not known.

This approach is wasteful of die area because the introduction of these diodes that include diffusion occupy additional area of the integrated circuit. For example, in certain designs, the use of diodes can occupy 30%-40% of the area of the gate array. Moreover, the introduction of these additional diffusion areas, by virtue of the layout rules, takes up additional area in addition to the actual diffusion area to meet these minimum distance requirements of the layout rule. Therefore, this approach wastes die area, increases the cost of the integrated circuit, and sacrifices transistor density. Accordingly, a method and apparatus for protecting the gate electrode of target transistors in a gate array that does not require the use of additional diffusion area and that reduces the cost and space consumption is desired.

SUMMARY OF THE INVENTION

A method and apparatus for protecting a gate electrode of a target transistor in a gate array by employing a free transistor in the gate array is disclosed. The gate array includes a plurality of transistors and is used to implement a specific logic design. In most cases, these transistors include free transistors and target transistors. Free transistors are simply transistors that are not used to implement the logic design. The target transistors are those transistors that are used to implement the logic design and are determined to require gate charging protection. Specifically, the gate electrode of the target transistors require protection from gate charge.

As noted previously, the process of metalization introduces gate charge which may damage the target transistors. For example, a floating gate electrode that is coupled to a drive transistor via a second metal layer is a candidates for gate charging protection.

In one embodiment of the present invention, the gate array includes a plurality of cells where each cell includes at least one target transistor and one free transistor. In this embodiment, the present invention, after determining that a transistor is a target transistor, couples the gate electrode of the target transistor to either the source or drain of a free transistor. The present invention couples the gate electrode of the free transistor to a first predetermined reference voltage (e.g., ground). In other words, the present invention couples the gate electrode of the target transistor to diffusion of a free transistor. Since the free transistors already exist in the gate array, the present invention saves the area and overhead associated with designing a special diffusion (effectively a protection diode) for each of the target transistors. The present invention advantageously utilizes the source and drain diffusion of those free transistors that are not allocated to implement the logic design of the gate array to protect the gate electrode of the target transistors.

In a second embodiment, the gate array includes a plurality of transistors. These transistors include free transistors and target transistors. In this embodiment, the present invention also determines which transistors, which are used to implement the logic design, require gate charging protection. The present invention couples the gate electrode of those target transistors, determined in the step above, to diffusion (e.g., the source or drain) of a free transistor. The gate electrode of the free transistor is tied to a reference voltage to turn the free transistor off. In this embodiment, the gate array may be subdivided into a plurality of cells. However, each cell may or may not have a free transistor.

For example, if a target transistor or a first cell requires gate charging protection, and that first cell does not include a free transistor, the present invention couples the target transistor of the first cell to a free transistor of a second cell. The present invention also modifies the layout and routing algorithms of the gate array software to provide a free transistor for every target transistor in the gate array. Typically, all transistors in a gate are not 100% utilized when a logic design is implemented. However, in some instances, the transistors in a group of adjacent cells can become fully utilized (i.e., all the cell transistors and adjacent cell transistors are employed to implement the logic function). In the event that a target transistor in a cell is identified, and all of the adjacent cell transistors are employed to implement the logic function (i.e., a free transistor does not exist in the vicinity of the target transistor to allow an interconnection), the gate array interconnect software algorithm of the present invention locates a free transistor in a cell that is not fully utilized. The present invention "moves" the free cell to where it is needed. This movement is not an actual physical movement of the free cell, but instead is changing the implementation of the logic design across more cells. For example, routing software may be used by the present invention to implement the logic design across more cells. In other words, the interconnections between the cells are changed in such a way that the free transistor appears in the vicinity of the target cell for connection to the gate electrode of the target transistor.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

Figure 1:
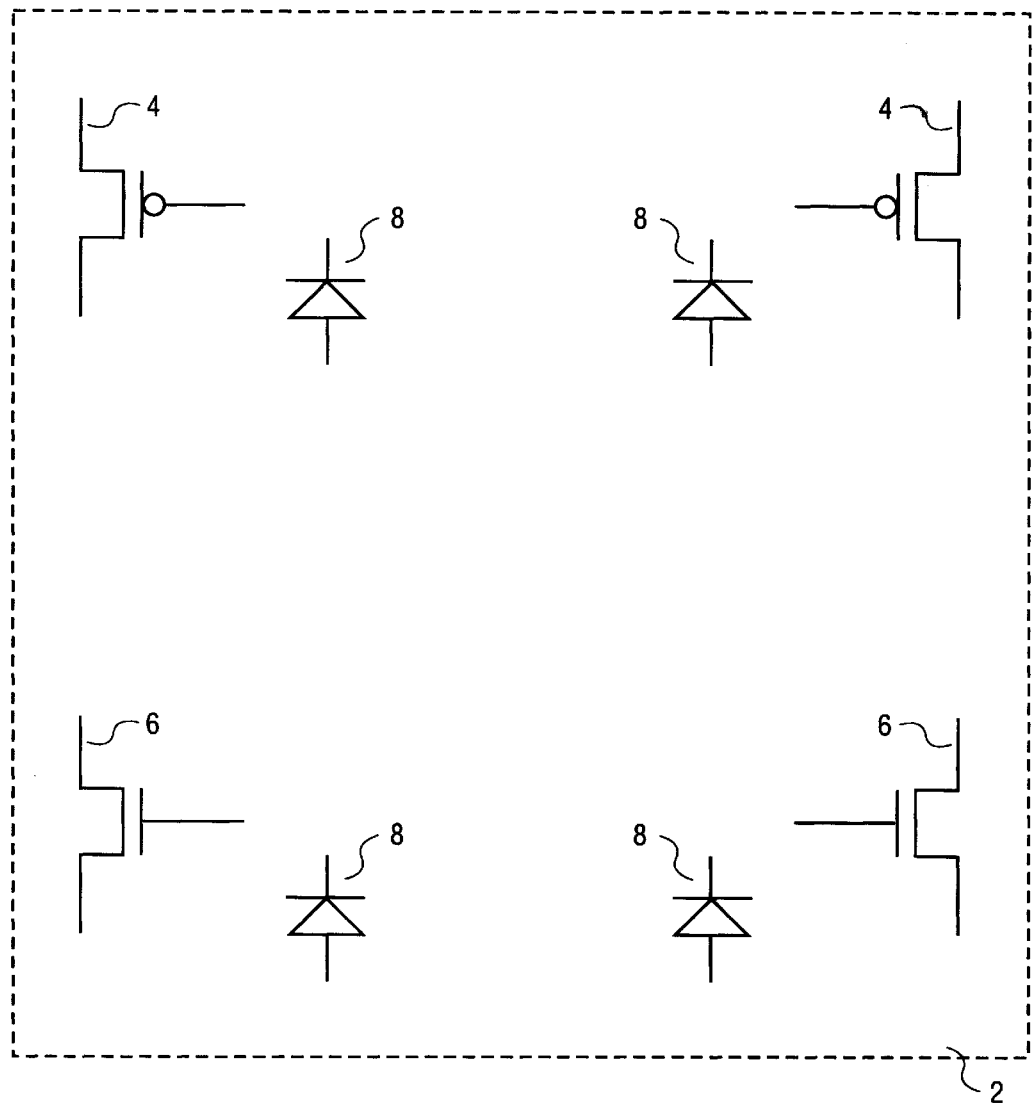
FIG. 1 illustrates a prior art basic cell that employs a prior art technique to prevent gate charging.

FIG. 1 illustrates a prior art basic cell that employs a prior art technique to prevent gate charging. This prior art basic cell 2 includes two P-channel metal-oxide-semiconductor (PMOS) transistors 4, two N-channel metal oxide-oxide-semiconductor (NMOS) transistors 6 and four node antenna charge (NAC) diodes 8. Since any of the NMOS or PMOS transistors may be a target transistor (i.e., a transistor requiring protection from gate charging), a NAC diode 8 is provided for each transistor.

Figure 2:
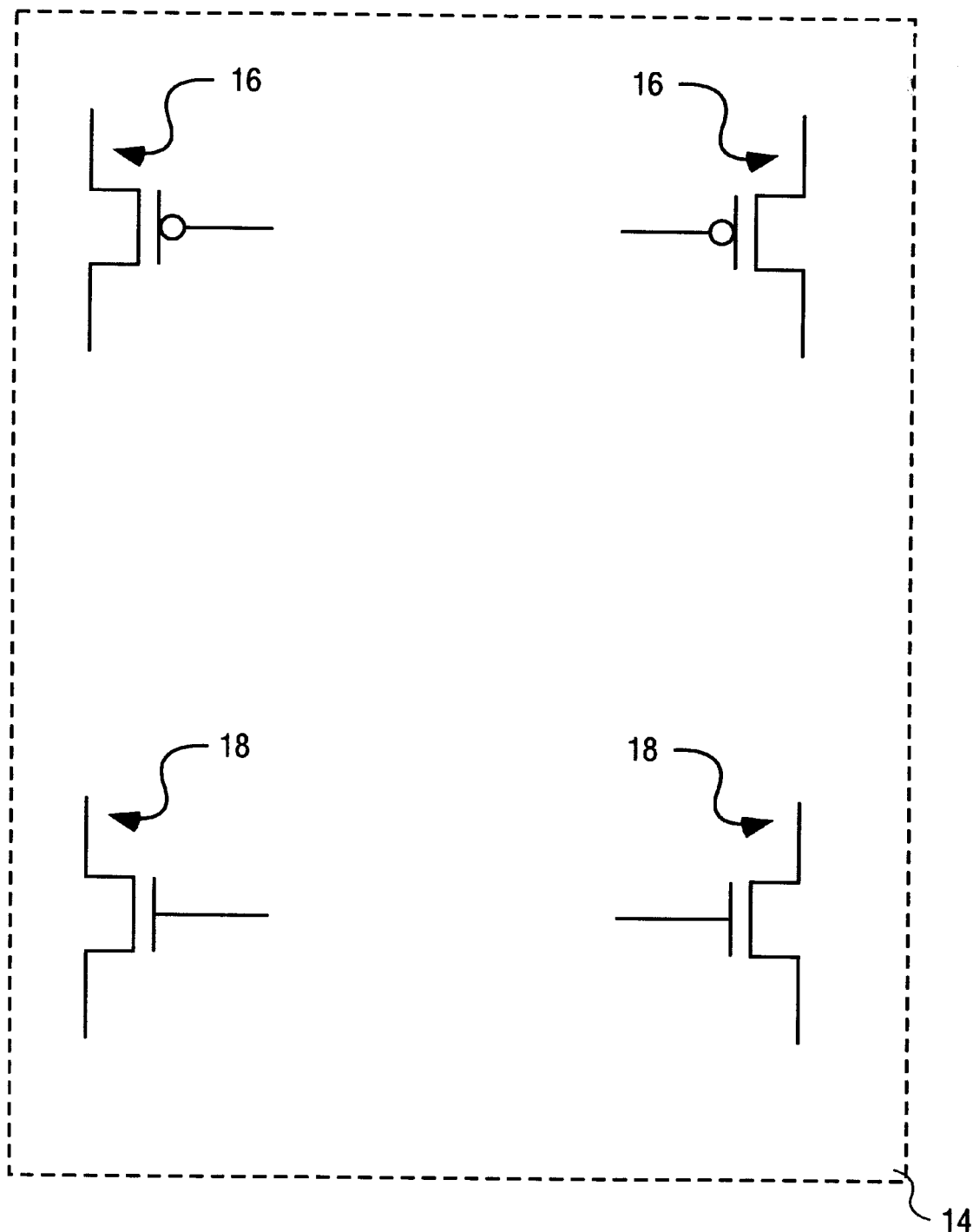
FIG. 2 illustrates a basic cell arranged in accordance to the teachings of the present invention.

FIG. 2 illustrates a basic cell of a gate array arranged in accordance to the teachings of the present invention. The basic cell of the present invention 14 also includes two P-channel MOS transistors 16 and two N-channel MOS transistors 18. It will be understood by those skilled in the art that although FIG. 2 illustrates the basic cell of the present invention as including two N-MOS transistors and two PMOS transistors, the actual number of N-MOS and P-MOS transistors is a function of the gate array, the logic design, and the specific application for which the gate array is being used. The actual number of N-MOS and P-MOS transistors can easily be adjusted to suit the needs of a circuit designer. It is important to note that the basic cell of the present invention does not include any additional protection devices for gate charging. In other words, the basic cell of the present invention does not include the NAC diodes 8, shown in FIG. 1. Accordingly, the die area taken by the basic cell of the present invention is less than the die area occupied by the basic cell of the prior art because the basic cell of the present invention does not include the additional NAC diodes 8. However, protection from gate charging is obtained by employing free transistors, as explained in detail with reference to FIGS. 6 and 10.

Figure 3:
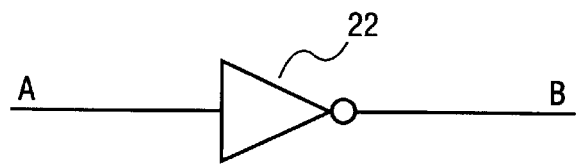
FIG. 3 illustrates a schematic symbol for an inverter.
Figure 4:
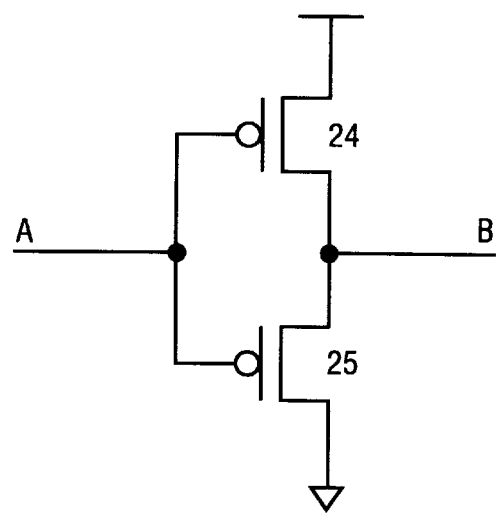
FIG. 4 illustrates a complementary metal-oxide semiconductor implementation of the inverter of FIG. 3.

FIG. 3 illustrates a schematic symbol for an inverter having an input (A) and an output (B). FIG. 4 illustrates a complementary metal-oxide semiconductor (CMOS) implementation of the inverter of FIG. 3. As is well-known in the art, an inverter may be implemented by employing a PMOS transistor 24 coupled to an NMOS transistor 25, as shown in FIG. 4.

Figure 5:
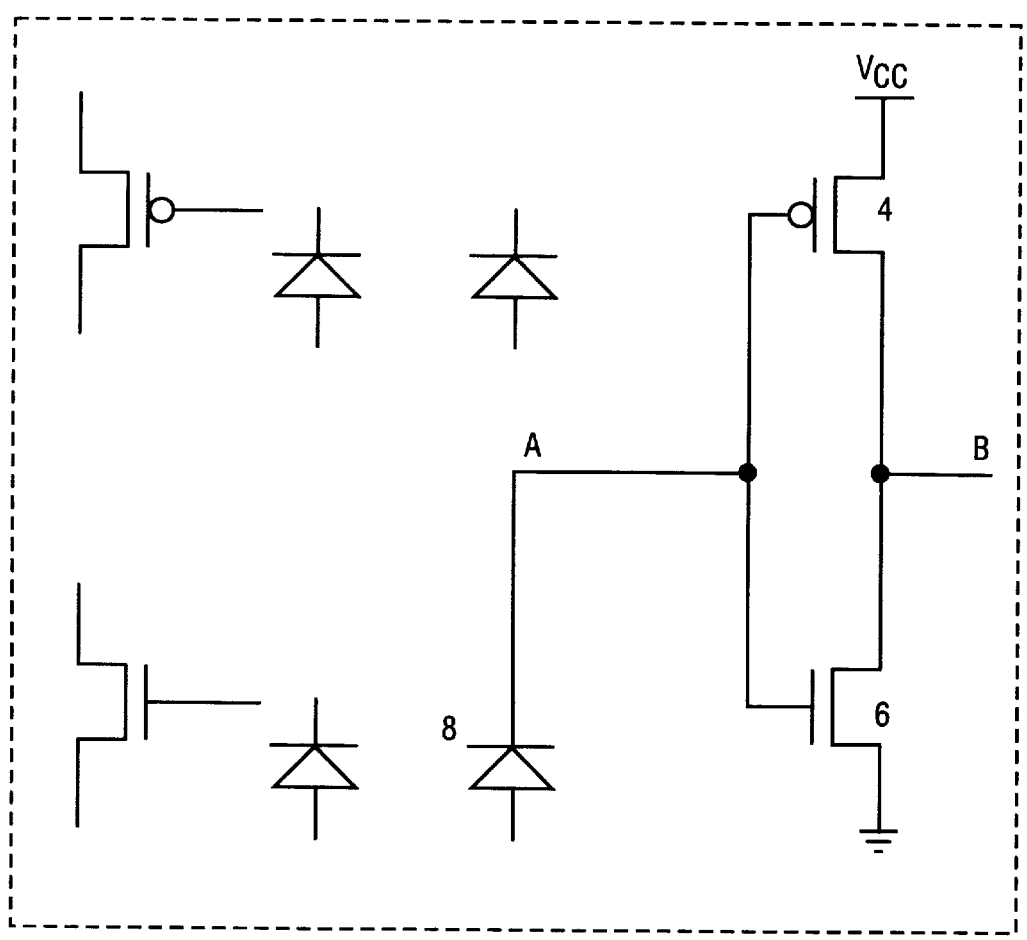
FIG. 5 illustrates an inverter configured in accordance with a prior art technique for preventing gate charging.

FIG. 5 illustrates an inverter 22 configured in accordance with a prior art technique for preventing gate charging. The inverter 22 is implemented using a PMOS transistor 4 and an NMOS transistor 6 where each transistor has a gate electrode, a drain electrode, and a source electrode. The source electrode of the PMOS transistor 4 is coupled to Vcc. The input of the inverter (node A) is coupled to the gate electrode of the PMOS transistor 4 and the gate electrode of the NMOS transistor 6. The output (node B) of the inverter is coupled to the drain electrode of the PMOS transistor 4 and the drain electrode of the NMOS transistor 6. Both the NMOS transistor 6 and the PMOS transistor 4 are in need of gate charging protection. Accordingly, the input of the inverter is coupled to the cathode of one of the NAC diodes 8, and the anode of the NAC diode 8 is coupled to the substrate of the semiconductor die.

Figure 6:
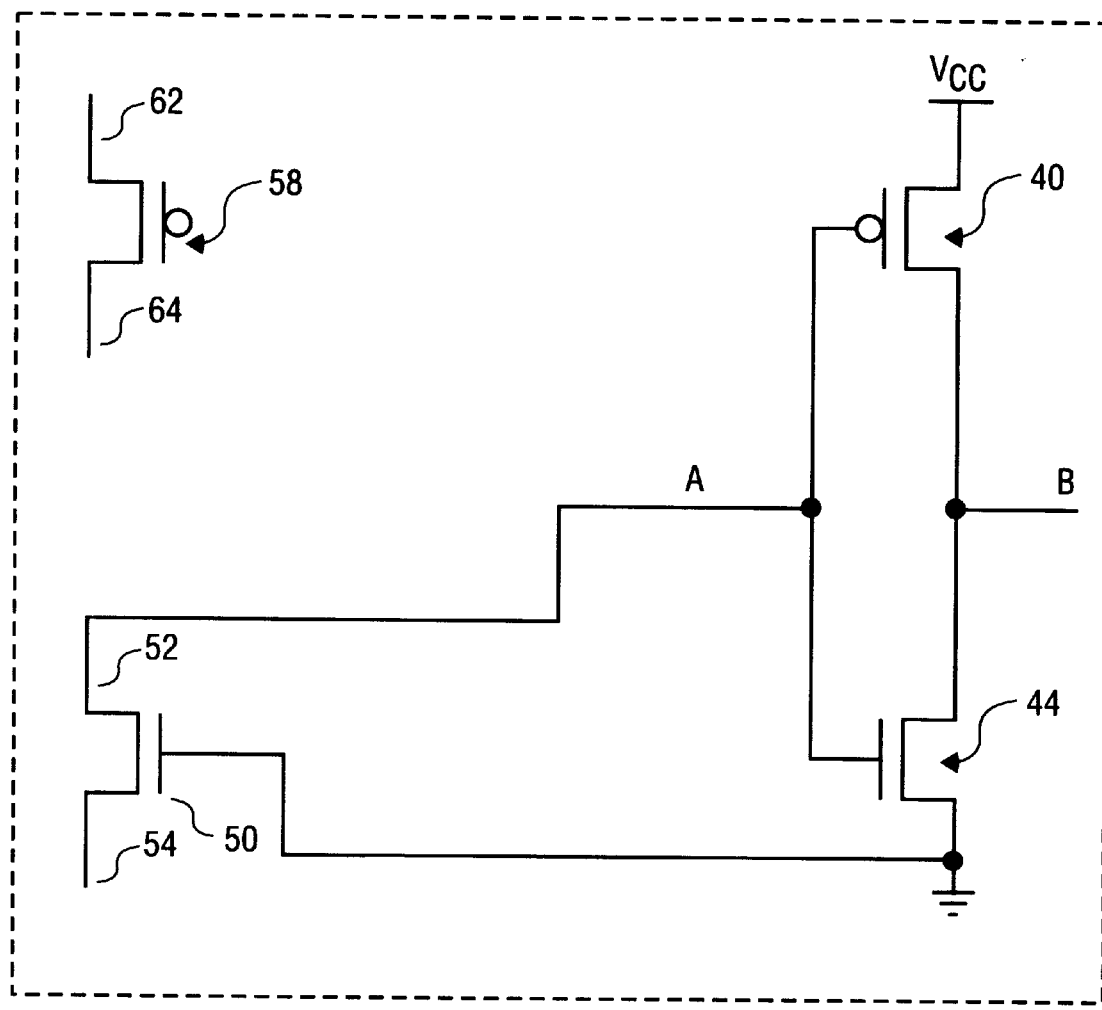
FIG. 6 illustrates an inverter configured in accordance with the teachings of the present invention.

FIG. 6 illustrates an inverter configured in accordance with the teachings of the present invention. In this embodiment, the inverter is implemented using a PMOS transistor 40 that includes a gate electrode, a source electrode and a drain electrode. The inverter also includes an NMOS transistor 44 that includes a gate electrode, a drain electrode and a source electrode. Both the PMOS transistor 40 and the NMOS transistor 44 are target transistors in that both transistors (40, 44) require gate charging protection. The source electrode of the PMOS transistor 40 is coupled to a first reference voltage (e.g., Vcc). The input of the inverter (node A) is coupled to the gate electrode of the PMOS transistor 40 and a gate electrode of the NMOS transistor 44. The output of the inverter (node B) is coupled to the drain electrode of the PMOS transistor 40 and the drain electrode of the NMOS transistor 44. The source electrode of the NMOS transistor 44 is coupled to a second reference voltage (e.g., ground potential).

The present invention employs a free transistor 50 (i.e., a transistor that is not used to implement the logic design of the gate array) as a protection device for transistors 40 and 44. The free transistor 50 in this embodiment is a NMOS transistor. The present invention couples the gate electrode of the free transistor 50 to the second reference voltage (e.g., ground potential) to insure that the free transistor is off. The present invention also couples the input of the inverter (node A) to diffusion (e.g., the source or drain) of the target transistor 50.

In this example, the input of the inverter is coupled to the drain diffusion 52. However, the input of the inverter (node A) may be coupled to the source diffusion 54 of the free transistor 50 for the same gate charging protection. If the PMOS transistor 58 is not used to implement the logic design of the gate array, the PMOS transistor 58 may also be utilized as a gate charging protection device (i.e., a free transistor). The PMOS transistor 58 includes a gate electrode, a drain electrode and a source electrode. For PMOS transistor 58 to act as a free transistor, the gate electrode of the PMOS transistor is coupled to the first reference voltage (Vcc). This high voltage at the gate electrode of the PMOS transistor 58 insures that the transistor 58 is turned off. Once transistor 58 is turned off, the source diffusion 62 and the drain diffusion 64 may be employed to provide gate charging protection to a target transistor (i.e., a transistor that needs gate charging protection).

Figure 7:
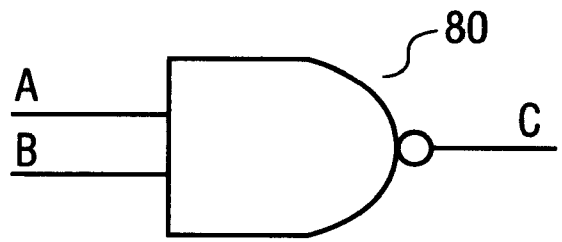
FIG. 7 illustrates a schematic symbol of a NAND gate.

FIG. 7 illustrates a schematic symbol of a NAND gate having two inputs (A, B) and one output C.

Figure 8:
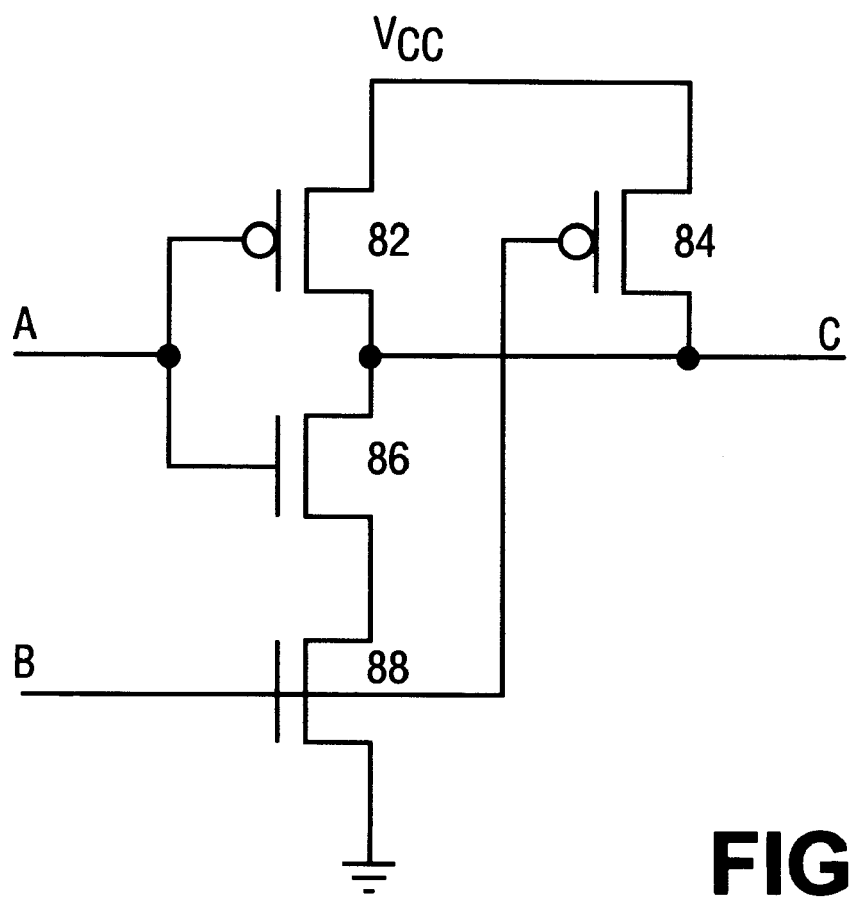
FIG. 8 illustrates a CMOS implementation of a NAND gate.

FIG. 8 illustrates a CMOS implementation of a NAND gate. The NAND gate 80 includes a first PMOS transistor 82, a second PMOS transistor 84, a first NMOS transistor 86, and a second NMOS transistor 88. Input A of NAND gate 80 is coupled to the gate electrodes of the PMOS transistor 82 and the NMOS transistor 86. Input B of NAND gate 80 is coupled to the gate electrode of the NMOS transistor 88 and the gate electrode of the PMOS transistor 84. The source electrodes of the PMOS transistors 82 and 84 are coupled to Vcc, while the drain electrodes of the PMOS transistors 82 and 84 are coupled to output C of the NAND gate 80. Output C is also coupled to the drain electrode of NMOS transistor 86. The second NMOS transistor 88 is coupled in series to the first NMOS transistor 86, and the source electrode of transistor 88 is coupled to a ground potential.

Figure 9:
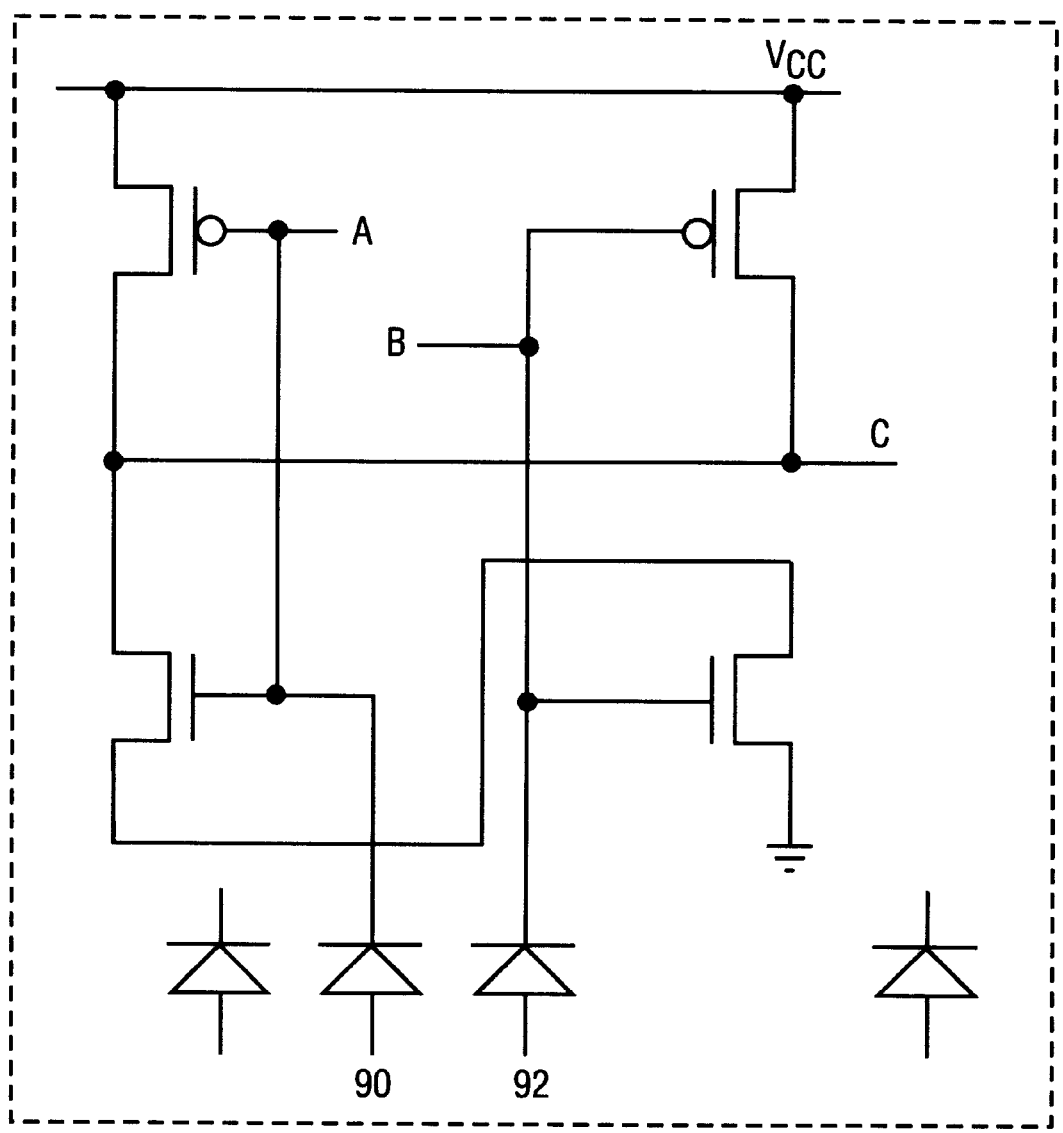
FIG. 9 illustrates a NAND gate configured in accordance with a prior art technique for preventing gate charging.

FIG. 9 illustrates NAND gate 80 configured in accordance with the prior art technique for preventing gate charging. It will be noted that input A and B are each connected to an associated NAC diode (90 and 92).

Figure 10:
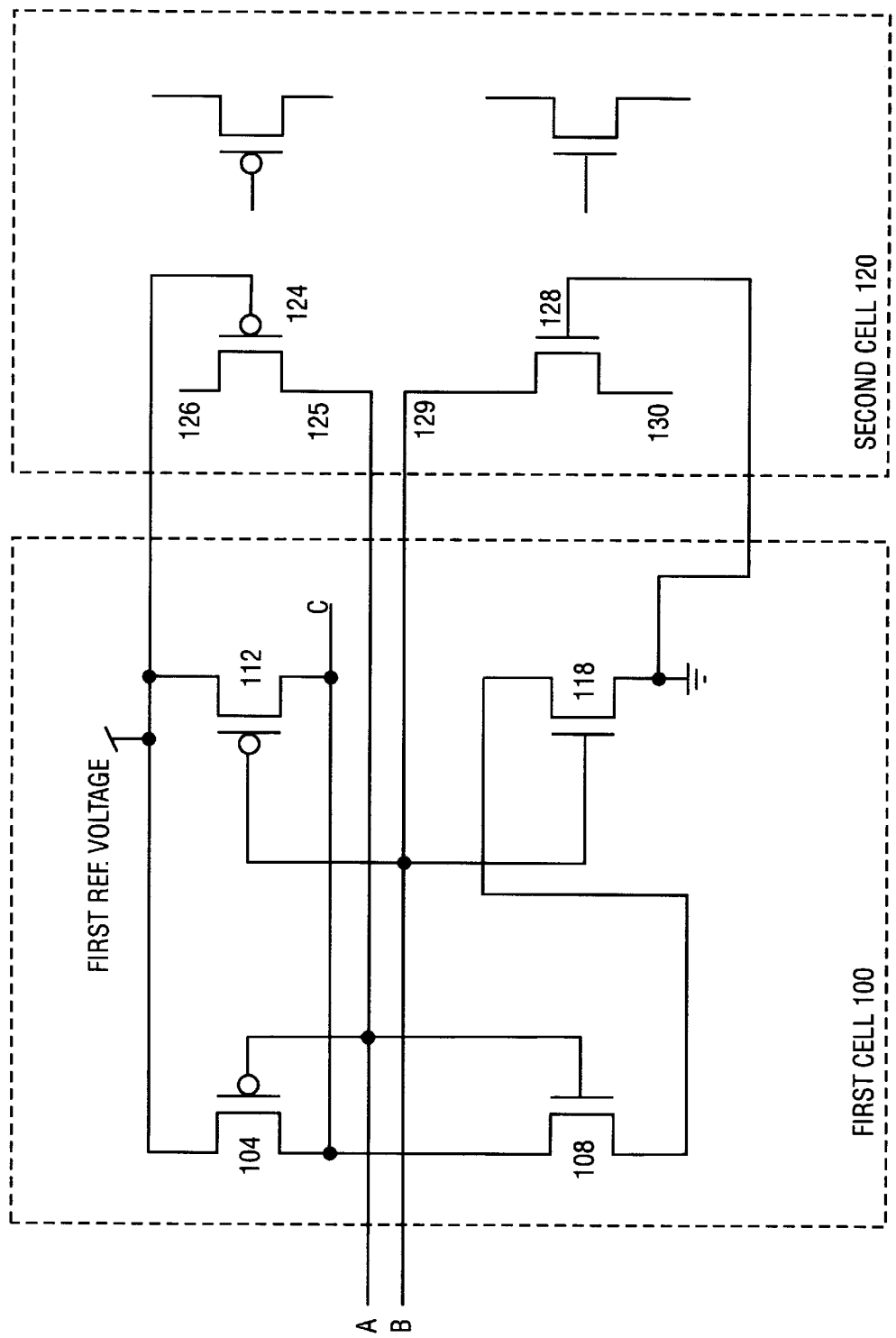
FIG. 10 illustrates a NAND gate configured in accordance with the teachings of the present invention.

FIG. 10 illustrates a NAND gate configured in accordance with the teachings of the present invention. FIG. 10 illustrates two cells of a gate array configured in accordance to the teaching of the present invention. In this alternative embodiment, each cell includes two PMOS devices and two NMOS devices. The transistors in the first cell 100 are used to implement the NAND gate. Since both input A and input B of the NAND gate require gate charging protection, and there are no free transistors in this embodiment in the first cell 100, the present invention utilizes free transistors in a second cell 120. Input A, which is coupled to PMOS transistor 104 and NMOS transistor 108, is also coupled to either the source or drain diffusion of free transistor 124. Since the free transistor 124 is a PMOS transistor, the gate electrode of the free transistor 124 is coupled to a first reference voltage (Vcc) to turn the free transistor off. Input B of the NAND gate is coupled to the gate electrode of PMOS transistor 112 and the gate electrode of NMOS transistor 118.

The present invention couples input B to a second free transistor 128 in the second cell 120. Since the free transistor 128 is a NMOS device, the gate electrode of transistor 128 is coupled to a second reference voltage (e.g., ground potential) to turn off transistor 128. Although input A is coupled to the drain diffusion 125 of PMOS transistor 124, input A may equally be coupled to the source diffusion 126 of PMOS device 124 in accordance with the teachings of the present invention. Similarly, although input B is coupled to the drain diffusion 129 of transistor 128, it could also equally be coupled to the source diffusion 130 of transistor 128 in accordance with the teachings of the present invention. Alternatively, node A may be coupled to source diffusion 130, while node B is connected to drain diffusion 129 in accordance with the teachings of the present invention. Also, node A may be connected to source diffusion 126 while node B is connected to drain diffusion 125.

Since the gate electrode of transistors 104 and 108 are coupled via metal in the first metal layer, both transistor 104 and 108 may be protected by coupling to a single diffusion (e.g., 125). Similarly, since the gate electrode of transistor 112 and 118 are coupled together via metal in the first metal layer, transistor 112 and 118 are protected by a single diffusion (e.g., 129). If the gate electrodes of transistors 104 and 108 (similarly, transistors 112 and 118) are coupled together by employing more than one metal layer (e.g. employing the first metal layer and the second metal layer and via), each transistor 104, 108, 112, 118 would require a separate and associated diffusion.

Figure 11:
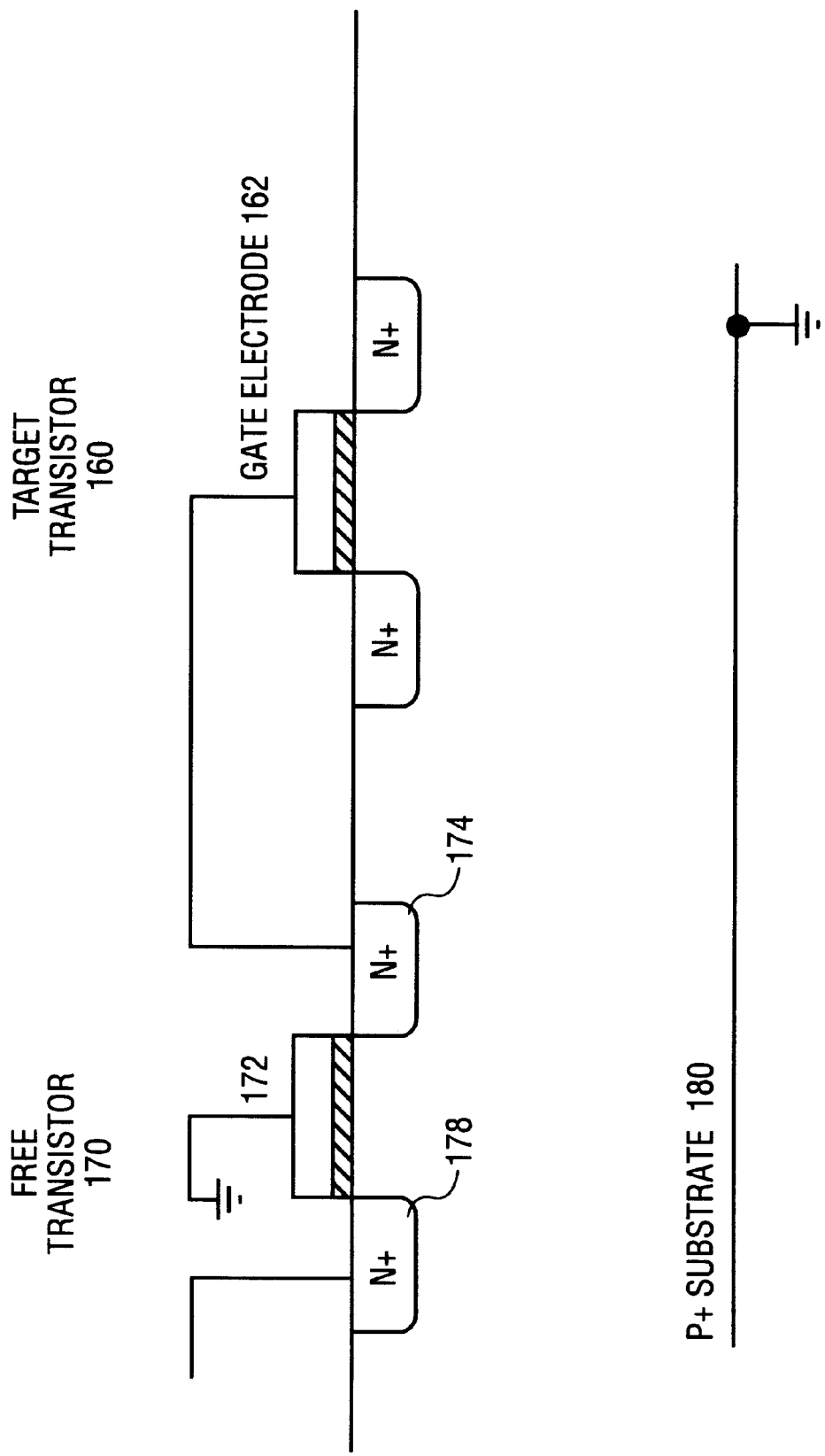
FIG. 11 illustrates a cross sectional area of a target transistor and a free transistor in accordance to one embodiment of the present invention.

FIG. 11 illustrates a cross sectional area of a target transistor and a free transistor in one embodiment of the present invention. FIG. 11 illustrates a target transistor 160 and a free transistor 170. In this embodiment, the target transistor 160 is an NMOS transistor having a gate electrode 162. The present invention couples the gate electrode 162 to an N– plus diffusion 174. The free transistor 170 in this embodiment is an NMOS transistor having its gate electrode 172 tied to a second reference voltage (e.g., ground potential) to turn the free transistor 170 off. The source diffusion (N+) 178 may be coupled to a second target transistor (not shown) to provide gate charging protection. The diffusion areas 174 and 178 in conjunction with the P+ substrate 180 act as protection devices (i.e., diode) that protect the gate electrodes of target transistor.

Figure 12:
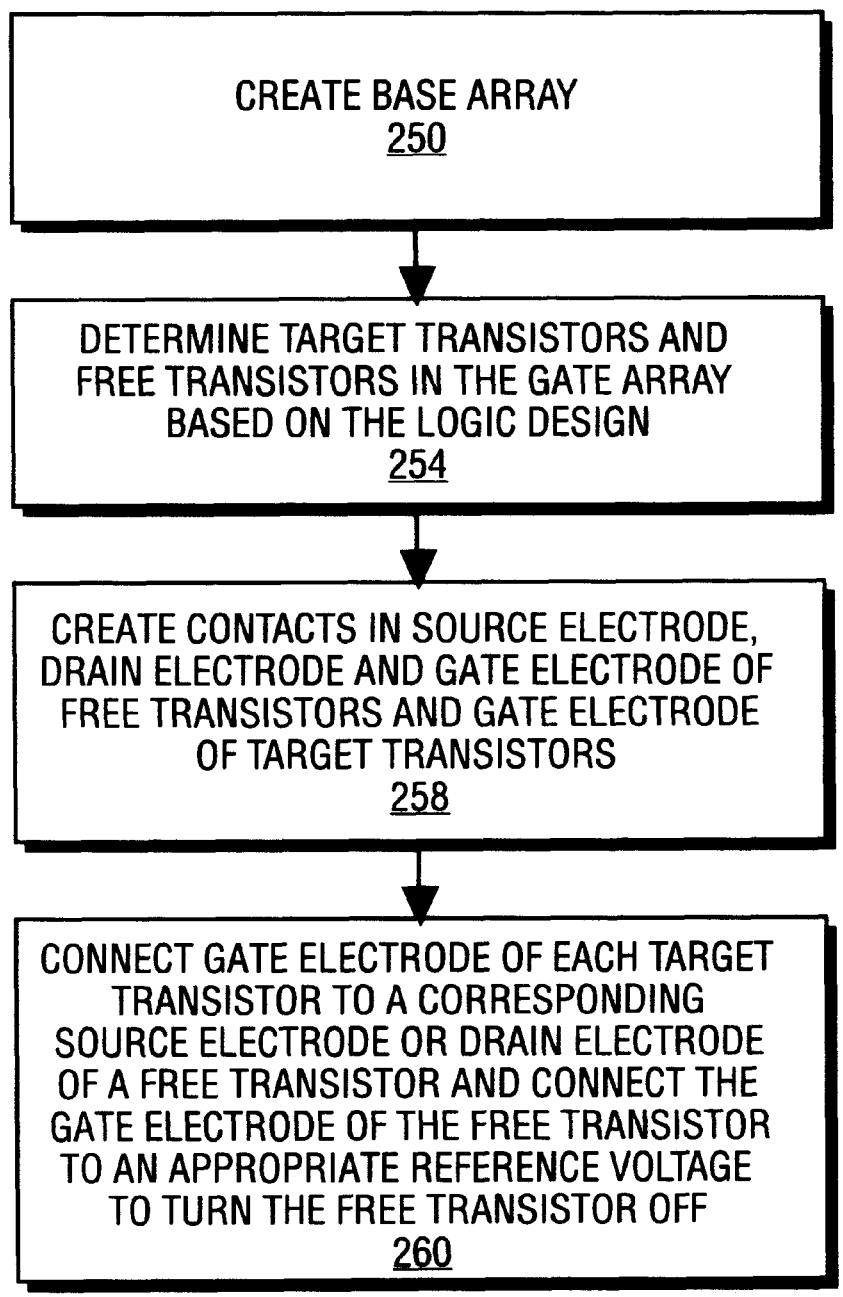
FIG. 12 illustrates a flowchart of the method steps of the present invention.

FIG. 12 illustrates a flowchart of the method steps of the present invention. In step 250, the base array is created. This step typically involves implanting channel stops, growing field oxide, growing gate oxide, depositing polysilicon, implanting source and drain diffusion, doping the polysilicon gate and is well known in the art. Moreover, one skilled in the art would understand that the specific steps for creating the base array is processed dependent. In step 254, the free transistors and the target transistors are determined based on the logic design. As noted previously, the free transistors are simply those transistors that are not used (i.e., not allocated) to implement the logic design. The target transistors are those transistors whose gate electrodes require protection from gate charging. The target transistors may be determined by software that detects floating gate electrodes. This software is well known in the art.

In step 258, contacts are formed in the source electrode, the drain electrode and the gate electrode of the free transistor and also in the gate electrode of the target transistor. The step of forming contacts (also known as metalization) typically includes the step of opening contact windows and then depositing metal in those windows. In one embodiment of the present invention, an insulator is formed on the base array. Next, windows (also called vias) are formed in the insulator. Next, a metal layer is formed over the insulator. The metal also fills the vias. The metal layer is then patterned and etched to make the desired interconnections. However, it would be understood by those skilled in the art that the specific steps for forming contacts is highly dependent on the process employed.

In step 260, the gate electrode of each target transistor is connected to a corresponding source electrode or drain electrode of a free transistor, and the gate electrode of the free transistor is coupled to an appropriate voltage reference (depending on whether it is an NMOS or PMOS device) to turn off the free transistor.

In this embodiment of the present invention, software (known as "place and route" software tools), which is known in the art, is employed to implement the specific logic design in the base array by generating the various contact, metal and via layers. The output of the place and route software tools is a layout database in a GDSII format, which is an industry standard layout database format. This GDSII layout database includes drawings (e.g., polygons) that define each layer and is used subsequently by mask vendors to create the masks for each layer. The layout database includes the base array with all the metalization (i.e., all the metal layers). The layout database is then provided as input into software that checks for design rule violations (also know as design rule checking flows).

In this embodiment of the present invention, the software specifically checks for a floating gate at every level starting with the first metal layer and ending with the top layer. For example, to detect a gate electrode that requires protection from gate charging, the following parameters, inter alia, may be checked: 1) a comparison of the area of metal to the area of a gate of a transistor; 2) the number of vias connected to any node; and 3) a comparison of the perimeter of metal versus the area of metal.

In this embodiment of the present invention, each cell in the gate array is designed with a free transistor (i.e., free diffusion). Moreover, free transistors are reserved in the layout design of each cell to provide protection and, specific steps are taken in accordance with the teaching of the present invention (e.g., turning off the free transistors and providing connections from the free diffusion to each input of the cell).

The steps of implementing a logic design in a gate array in accordance with the teachings of the first embodiment of the present invention are as follows. First, the cells in a gate array library are designed so that each cell includes one or more free transistors. Moreover, the gate of the free transistor(s) are tied to an appropriate voltage to turn-on the free transistors. Furthermore, contacts are created in the free diffusion and a connection is provided via metal from the contact on the free diffusion to an associated input of each cell. Each input has a corresponding free diffusion. A non-mask layer is created that identifies optional contacts, which if implemented, connects a gate electrode of a target transistor to a free diffusion. The optional contacts that are identified in the non-mask layer are used to selectively connect a free diffusion to a gate electrode of the target transistor if it is determined that the target transistor requires a protection from gate charging.

A place and route software tool is utilized to create the layout of the gate array. The design rule checking software then identifies the nodes in the layout that are in violation of the design rules. Specifically, for violations of the NAC (gate charging) rules, computer software, configured in accordance with the teachings of the present invention, compares the special non-mask layer having the optional contacts with the intersection of the node requiring protection, and moves the optional contact from the non-mask layer so that a real contact is formed on the metal layer that is currently being evaluated.

As noted previously, the present invention prevents damage to a wafer while it is being processed. Specifically, the intermediate metalization stages are the source of harmful charges that endanger the gates of target transistors. It will be understood by those skilled in the art that after all metal layers have been formed, every gate electrode will be connected to diffusion. However, it will be equally recognized by those skilled in the art that protection for gate electrodes of target transistors during intermediate steps of forming metal layers during the processing of a wafer helps to prevent damage to the chip.

The step of finding or identifying a target transistor of the present invention involves determining whether a gate electrode is floating, and more specifically, whether that gate electrode is in danger of being damaged by gate charging. For example, after the base array is created, a contact layer is formed (i.e., contacts are formed to connect the first metal layer to diffusion or the first metal layer to polysilicon). In this first contact layer, the design rule check of the present invention may be implemented to determine those gate electrodes of a target transistors that may be in danger. In forming the first metal layer, the design rule check of the present invention may also be employed to determine a gate electrode of a target transistor that is in danger. Subsequently, the via layer (for connecting the metal layers to each other), the subsequent metal layers, and subsequent contact layers may each be checked to determine whether or not a gate electrode of a target transistor is at risk.

Figure 13:
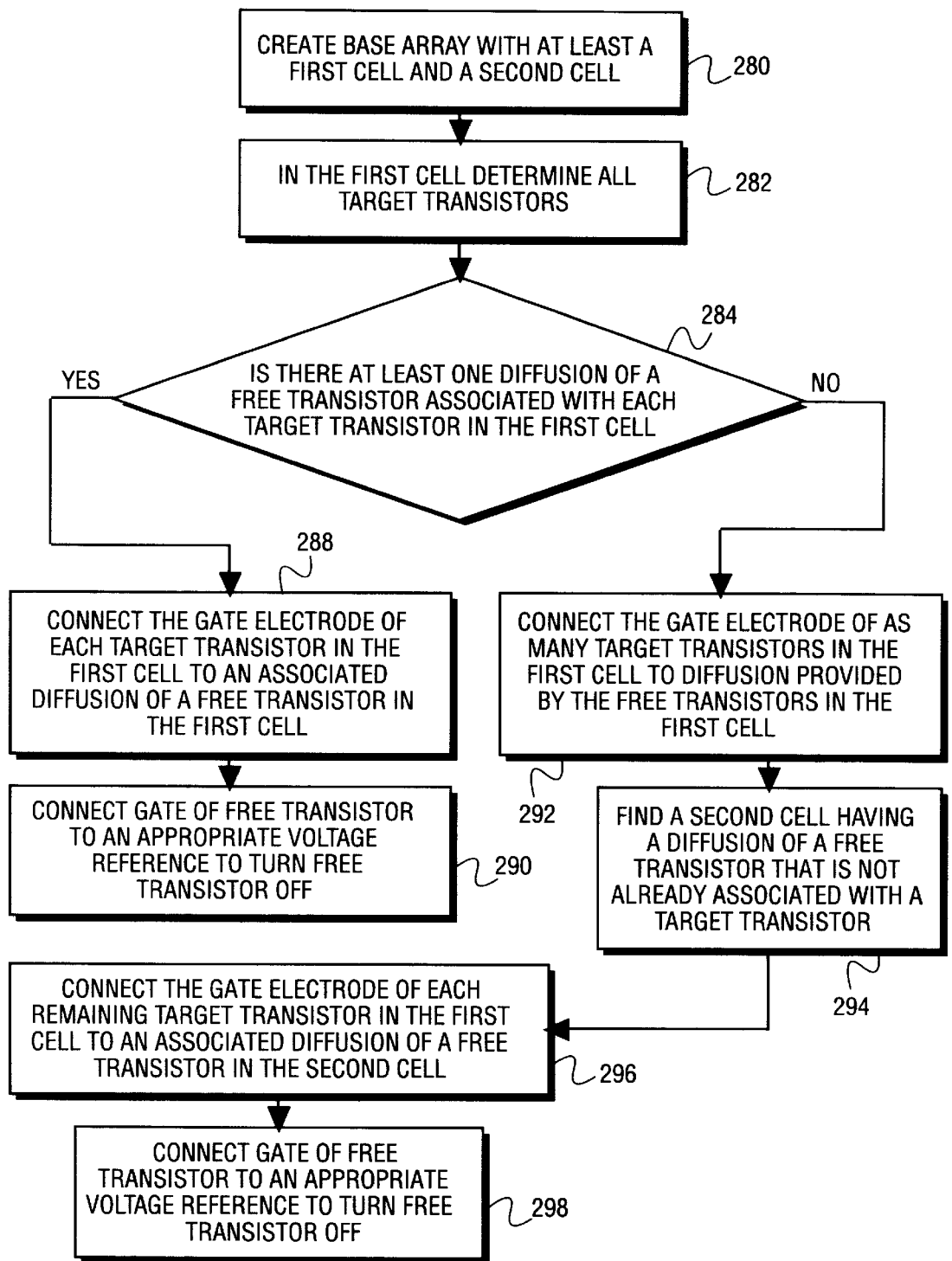
FIG. 13 illustrates the method steps of an alternative embodiment of the present invention.

FIG. 13 illustrates a flowchart of the method step of an alternative embodiment of the present invention. In this embodiment, the gate array is divided into a plurality of cells. In step 280, the base array is created with at least a first cell and a second cell. In step 282, a determination is made of all target transistors in the first cell. In decision block 284, a determination is made whether there is at least one diffusion of a free transistor associated with each target transistor in the first cell. If yes, in step 288, the gate electrode of each target transistor in the first cell is connected to an associated diffusion of a free transistor in the first cell. In step 290, the gate of the free transistor is connected to an appropriate voltage reference to turn off the free transistor. If the answer to the query of decision block 284 is no, in step 292, the gate electrode of as many target transistors in the first cell are coupled to diffusion provided by free transistors in the first cell. In step 294, a second cell having a diffusion of a free transistor that is not already associated with a target transistor in the second cell is located. In step 296, the gate electrode of each remaining target transistor in the first cell is connected to an associated diffusion of a free transistor in the second cell. In step 298, the gate of the free transistor in the second cell is coupled to an appropriate voltage reference to turn off the free transistor.

Figure 14:
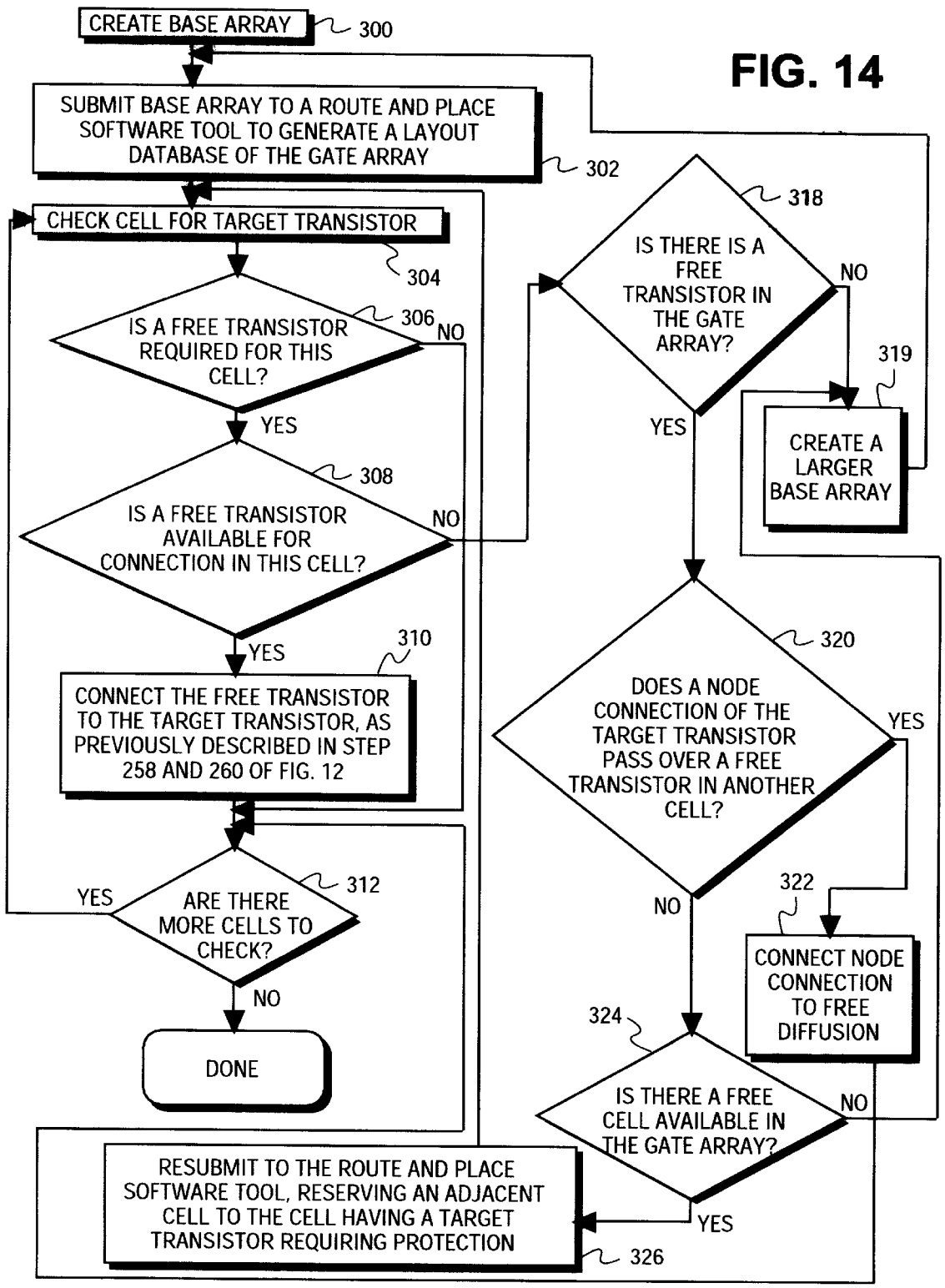
FIG. 14 illustrates a flow chart of the method steps of locating a free transistor in the gate array and reconnecting the cells in a gate array such that the free transistor becomes available for connection to a target transistor.

FIG. 14 illustrates a flowchart of the method steps of an alternative embodiment of the present invention. In this embodiment, the gate array is also divided into a plurality of cells. The flowchart of FIG. 14 illustrates a generalized case and presents the methodology for providing gate charging protection for all target transistors in the gate array by employing the free transistors of the gate array.

In step 300, the base array is created. In step 304, the present invention checks a first cell for target transistors. In decision block 306, a determination is made whether a free transistor is required for the cell. If yes, in decision block 308, a further determination is made whether a free transistor is available for connection to the target transistor in that cell. If yes, in step 310, the present invention performs steps 258 and 260 of FIG. 12. If no, the present invention determines if there is a free transistor in the gate array (decision block 318).

If yes, the present invention makes the further determination of whether a node connection of the target transistor passes over a free transistor in another cell (decision block 320). If yes, in step 322, the node connection is coupled to the free diffusion in accordance with the teachings of the present invention as illustrated in FIG. 13. If no, the present invention makes a further determination whether a free cell is available in the gate array (decision block 324). A free cell is simply a cell in which all transistors therein are unused or not employed to implement the logic design If yes, the present invention resubmits the base array to the route and place software tools, reserving an adjacent cell to the cell having the target transistor, which requires protection (processing step 326). It is important in the selection of an adjacent cell that is reserved in processing step 326 to accommodate the wiring profile (i.e., the layout of the wiring channels) of the gate array. Processing proceeds from step 326 to step 304.

If the determination in decision block 324 is negative, processing continues to step 319, where a larger base array is created. Subsequently, the processing flow continues to processing step 302.

If the determination in decision block 318 is negative, a larger base array is created in step 319. Subsequently, the processing flow proceeds to processing step 302.

If the determination in decision block 306 is no, processing also proceeds to step 312. In step 312, a determination is made whether or not there are more cells to check. If yes, the processing proceeds to step 304. If no, the processing is completed.

Figure 15:
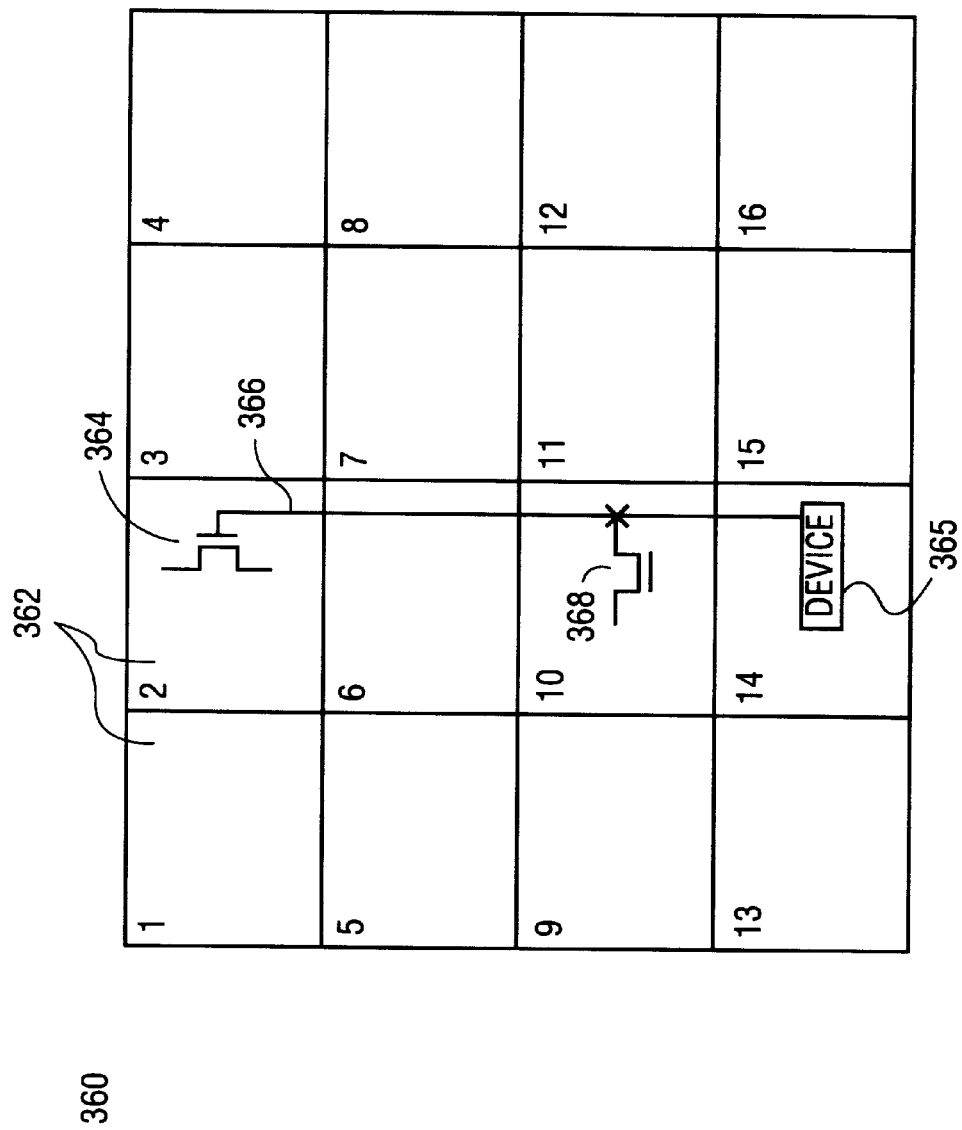
FIG. 15 illustrates a gate array in which specific processing steps of FIG. 14 may be implemented.

FIG. 15 illustrates a gate array 360 having a plurality of cells 362, which are numbered 1 through 16. Cell number 2 includes a target transistor 364 that requires protection from gate charging. The gate electrode of said target transistor 364 is eventually (or intended to be) coupled to a device 365 in cell 14 (i.e., the node connection for the gate electrode of target transistor 364 passes through cells number 6 and 10 to provide for a future connection to device 365 in cell 14). Processing step 320 of FIG. 14, checks to see if the node connection passes over any free transistors located in cells 6, 10 and 14. In this case, if there is a free transistor 368 in cell 10, the node connection may be coupled to the free diffusion by simply employing a contact to connect the node connection to the free diffusion. In other words, the present invention follows the trace of the node connection from the gate electrode of the target transistor 364 to whichever device(s) 365 that it is coupled to and determines whether or not the node connection passes above any free diffusion. If so, a contact or a connection is made to that free transistor. It is important that the node connection 366 is coupled to target transistor 364 and that it does not couple to any other layer before its connection to free transistor 368.

Figure 16:
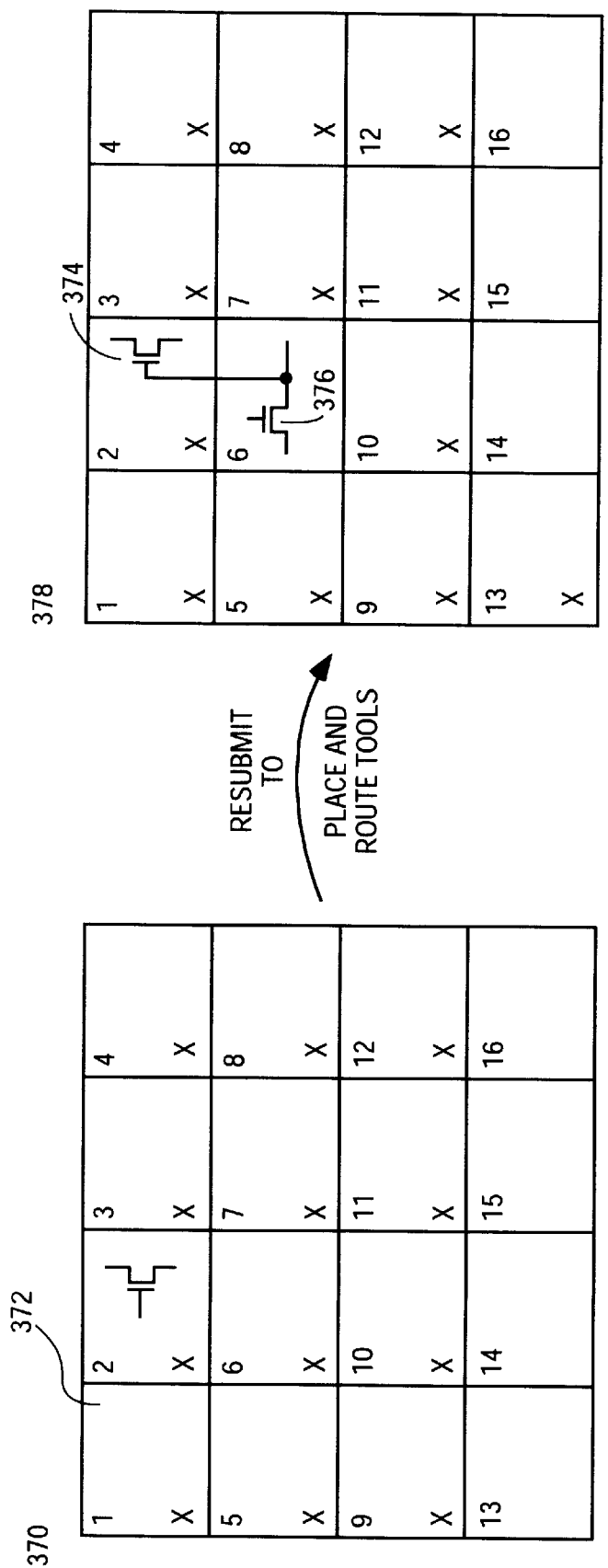
FIG. 16 illustrates a gate array in which other specific processing steps of FIG. 14 may be implemented.

FIG. 16 illustrates a gate array 370 having a plurality of cells 372 that are numbered 1 through 16. An "X" in a cell indicates that all transistors in that cell are employed to implement the logic design (i.e., there are no free transistors in those cells). Those cells without any markings are either free cells (i.e., cells where all transistors in the cell are not used to implement the logic design) or cells that contain at least one free transistor. Processing step 320 of FIG. 14 determines whether or not a free cell exists in the gate array (i.e., a cell having all its transistors being unused). If there is a free cell, the present invention resubmits the base array to the place and route software tools, reserving one of the adjacent cells to the cell having the target transistor. For example, if cell number 2 includes a target transistor 374, and an adjacent cell (e.g., cell 1, 5, 6, 3, or 7) is reserved, the resulting layout database 378 of the gate array is generated when cell 6 is reserved as a free cell. The present invention then uses a free transistor 376 from cell 6 to provide protection to target transistor 374 in cell 2 as illustrated. Specifically, a connection is made between a free transistor in an adjacent cell to the gate electrode of the target transistor by employing metal and contacts, in accordance with the steps illustrated in FIG. 13.

Figure 17:
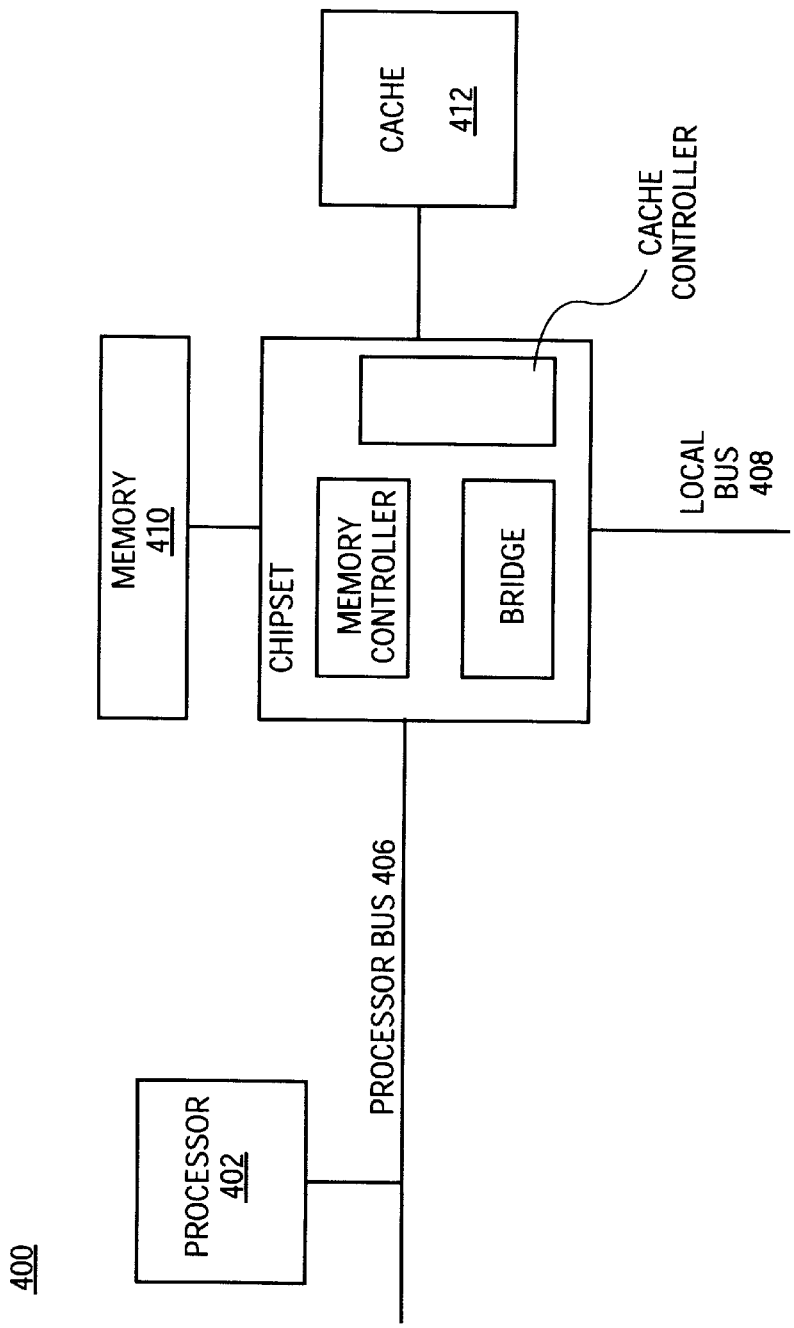
FIG. 17 illustrates a computer system in which the present invention may be implemented.

FIG. 17 illustrates a computer system in which the present invention may be implemented. A computer system 400 typically includes a processor 402 (e.g., Intel Pentium or P6 processor) coupled to a chip set 404 (e.g. the Trident Chipset) via a host processor bus 406. A chip set 404 typically includes a set of chips that perform, inter alia, the following functions (1) a bridge between the host processor bus 406 and a local bus 408 (e.g., the Peripheral Component Interconnect PCI bus); (2) a memory controller for controlling access to a memory 410; and a cache controller for controlling cache access 412. The logic design of the bridge, the memory controller and the cache controller, along with any associated logic (e.g., Input/Output logic; interrupt logic), may be implemented in a gate array that is manufactured in accordance with the teachings of the present invention.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A method for protecting a first transistor in a gate array from gate charging, said gate array implementing a logic function, said method comprising:
    a) creating a base array having at least one free transistor and said first transistor, said free transistor not employed to implement said logic function; said first transistor and free transistor each having a gate electrode, said free transistor having a drain electrode;
    b) forming contacts in the gate electrode of the free transistor, the gate electrode and the drain electrode of the target transistor; and
    c) coupling said gate electrode of said first transistor to the drain electrode of said free transistor and connecting the gate electrode of the free transistor to a first reference voltage to turn the free transistor off wherein the free transistor is at least one of a NMOS transistor and a PMOS transistor.

2. The method of claim 1, further comprising:
    a) dividing said base array into a plurality of cells;
    b) checking if a first cell includes a target transistor that requires gate charging protection;
    c) if so, determining if a free transistor is available for connection to this target transistor in said first cell;
    d) if not, locating a free transistor in said gate array; and
    e) reconnecting the cells in the gate array so that a free transistor becomes available for connection to the target transistor in the first cell.

3. The method of claim 1, further comprising determining if said first transistor is a target transistor, said target transistor being a transistor that is suitable candidate for gate charging protection.

4. The method of claim 3, wherein determining if said first transistor is a suitable candidate for gate charging protection comprises:

determining if the gate electrode of the first transistor is floating.

5. The method of claim 4, wherein determining if the gate electrode of the first transistor is floating further includes:

checking a predetermined set of design rules and flagging any design rule violation.

6. A method for protecting a first transistor in a gate array from gate charging, said gate array implementing a logic function, said method comprising:

a) creating a base array having at least one free transistor and said first transistor, said free transistor not employed to implement said logic function; said first transistor and free transistor each having a gate electrode, said free transistor having a source electrode;

b) forming contacts in the gate electrode of the free transistor, the gate electrode and the source electrode of the target transistor; and c) coupling said gate electrode of said first transistor to the source electrode of said free transistor and connecting the gate electrode of the free transistor to a first reference voltage to turn the free transistor off wherein the free transistor is at least one of a NMOS transistor and a PMOS transistor.

* * * * *